United States Patent
Utagikar et al.

(10) Patent No.: US 6,583,513 B1
(45) Date of Patent: Jun. 24, 2003

(54) INTEGRATED CIRCUIT PACKAGE WITH AN IC CHIP AND PADS THAT DISSIPATE HEAT AWAY FROM THE CHIP

(75) Inventors: Ajit Utagikar, Fort Collins, CA (US); Num-Kwee Chong, Singapore (SG)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/686,490

(22) Filed: Oct. 10, 2000

(30) Foreign Application Priority Data

Oct. 12, 1999 (SG) .......................................... 9905172

(51) Int. Cl.[7] .............................................. H01L 29/40
(52) U.S. Cl. ...................... 257/778; 257/678; 257/779; 257/780
(58) Field of Search ................................. 257/706, 720, 257/712, 778, 738, 780, 795, 779; 438/108, 612, 613

(56) References Cited

U.S. PATENT DOCUMENTS

| | | | |
|---|---|---|---|
| 5,798,567 A | 8/1998 | Kelly | 257/723 |
| 5,889,324 A * | 3/1999 | Suzuki | 257/712 |
| 5,939,783 A * | 8/1999 | Laine et al. | 257/702 |
| 6,046,499 A * | 4/2000 | Yano | 257/712 |
| 6,140,707 A * | 10/2000 | Plepys et al. | 257/778 |
| 6,154,366 A * | 11/2000 | Ma et al. | 361/704 |
| 6,204,562 B1 * | 3/2001 | Ho | 257/777 |
| 6,277,672 B1 * | 8/2001 | Ho | 438/121 |
| 6,291,893 B1 * | 9/2001 | Tiziani | 257/778 |
| 6,380,620 B1 * | 4/2002 | Suminoe et al. | 257/706 |
| 6,384,485 B1 * | 5/2002 | Matsushima | 257/778 |
| 6,396,145 B1 * | 5/2002 | Nagai et al. | 257/737 |
| 6,479,903 B2 * | 11/2002 | Briar | 257/778 |

FOREIGN PATENT DOCUMENTS

JP 406216284 A * 8/1994

* cited by examiner

*Primary Examiner*—Wael Fahmy, Jr.
*Assistant Examiner*—Nathan W. Ha

(57) ABSTRACT

An integrated circuit package comprising a substrate, and a chip die mounted on the substrate. The substrate includes electrically conductive traces, a set of primary interconnects arranged to couple to output pads of the chip die, and a set of secondary interconnects for coupling the package to external circuitry. A first subset of the primary interconnects are electrically coupled to the secondary interconnects and a second subset of the primary interconnects are thermally coupled using thermal vias to the opposite surface of the substrate. The output pads associated with the first subset of the primary interconnects therefore function as electrically interconnecting pads whereas the output pads associated with the second subset of the primary interconnects function as non-electrically interconnecting thermal-dissipation pads.

16 Claims, 5 Drawing Sheets

INTEGRATED CIRCUIT PACKAGE WITH AN IC CHIP AND PADS THAT DISSIPATE HEAT AWAY FROM THE CHIP

This invention relates generally to integrated circuit packages. In particular, the invention relates to an improved integrated circuit package which includes an integrated circuit chip and provides electrical interconnections between the integrated circuit chip and a circuit board, card or other substrate on which the integrated circuit package may be disposed.

BACKGROUND OF THE INVENTION

Integrated circuits (ICs) are used in most categories of technological products embracing both commercial and military applications. Traditionally, a silicon chip die or integrated circuit chip is electrically coupled to a package substrate using wire bonding between output pads located around the periphery of the die and conductive traces on the package. As the number of interconnections to integrated circuit (IC) chips increases, forming the required number of output pads around the chip periphery becomes impractical.

One solution which provides increased output pad density is the "flip chip" package. The flip chip package has an area array configuration in which the active side of the chip die includes an array of output pads. A passivation layer coated on the active surface of the chip die around the output pads protects the chip's active components from environmental contaminants. Instead of electrically coupling the chip or die to the package substrate using traditional wire bonding techniques, solder bumps are formed on the array of output pads of the chip. The solder bumps are approximately spherically-shaped solidified solder and are typically of a tin-lead composition. The chip is flipped so that its solder bumps are positioned or aligned in registering contact to a connecting pattern of conductive traces formed on a package substrate. The temperature is then increased to cause the solder bumps to reflow for direct electrical and mechanical bonding of the output pads of the chip to contact sites on the package substrate.

The wire bonding and the solder bump techniques outlined above are both used to create primary interconnects between the IC chip and the IC package substrate.

Coupling of the integrated circuit package to a circuit board, card or other suitable substrate using secondary interconnects may be achieved in a number of ways. Commonly used secondary interconnections include, for example, peripheral leads (as found in quad flat packages), pin grid arrays, ball grid arrays, and socket connections.

U.S. Pat. No. 5,798,567, assigned to Hewlett-Packard, discloses in the prior art section a typical quad flat package and a typical ball grid array (BGA) package. The inventive embodiment of U.S. Pat. No. 5,798,567 show an IC package with primary interconnects in the form of solder bumps which electrically couple the chip die to the BGA substrate. Secondary interconnects are provided by a set of relatively large solder balls which electrically interconnect the BGA substrate to a circuit board. Power supply vias, ground vias, and electrically conductive traces interconnect the solder bumps to the larger solder balls.

To improve device reliability the chip die is usually insulated from the environment and from mechanical stresses by surrounding the die with a sealed lid or an overmold compound.

Semiconductor chip dice, like other electronic devices, generate heat during operation. This generated heat must be dispersed from the die to ensure that the temperature of the chip remains within an optimum operating range. Heat dispersion techniques are therefore an important consideration in the design of a semiconductor package.

A drawback with "flip chip" package designs is that heat dissipation is relatively low compared to other chip packages such as wire-bonded packages. Furthermore, as the number and density of output pads increases in the "flip chip" package, the rate of heat generation tends to increase leading to an escalation of the heat dissipation problem. There is thus a need for increasingly efficient heat dispersion techniques for use in "flip chip" packages to ensure the chip die operates effectively.

SUMMARY OF THE INVENTION

The present invention provides an integrated circuit package including an integrated circuit chip or die with a plurality of pads (which can include pads used for input/output signals, power supply, and/or grounding) coupled to a set of primary interconnects or conductors. A first subset of the pads is used for interconnection purposes whilst a second subset of the pads is employed purely to disperse heat away from the chip (the electrical interconnects can also be used for heat dispersion). In this way, the chip can be maintained at an optimum temperature during operation.

According to a first aspect of the present invention there is provided an integrated circuit package comprising: a substrate; a chip die; a plurality of pads carried by the chip die, a first subset of the pads in electrical communication with circuitry in the chip die and a second subset of the pads in thermal communication with the chip die; a plurality of external interconnects carried by the substrate; a plurality of electrical conductors for carrying electrical signals between the external interconnects and the first subset of pads; and a plurality of thermal conductors for carrying heat from the second subset of pads to the substrate.

According to a second aspect of the present invention there is provided an integrated circuit package comprising; a planar substrate having first and second major surfaces and a plurality of electrically conductive traces, a chip die mounted on the first major surface of the substrate, the chip die having a plurality of output pads, a set of primary interconnects arranged to couple the output pads of the chip die to the electrically conductive traces of the substrate, and a set of secondary interconnects arranged to couple the electrically conductive traces to external circuitry, wherein a first subset of the primary interconnects are electrically coupled using the electrically conductive traces to the secondary interconnects, such that the output pads associated with the first subset of the primary interconnects function as electrically interconnecting pads, and a second subset of the primary interconnects are thermally coupled using thermal vias to the second major surface of the substrate, such that the output pads associated with the second subset of the primary interconnects function as non-electrically interconnecting thermal-dissipation pads.

An integrated circuit package in accordance with the invention has the advantage that during operation, heat may be drawn away from the chip through dedicated thermal-dissipation pads which can be coupled using standard techniques to a set of dedicated thermal primary interconnects or conductors. Thermal vias may be employed to provide a thermal path from the second subset of primary interconnects to the opposite side of the package substrate. Thus, the package is able to efficiently disperse heat from the chip in a simple and effective manner.

DESCRIPTION OF THE PREFERRED EMBODIMENTS

Figure 1:
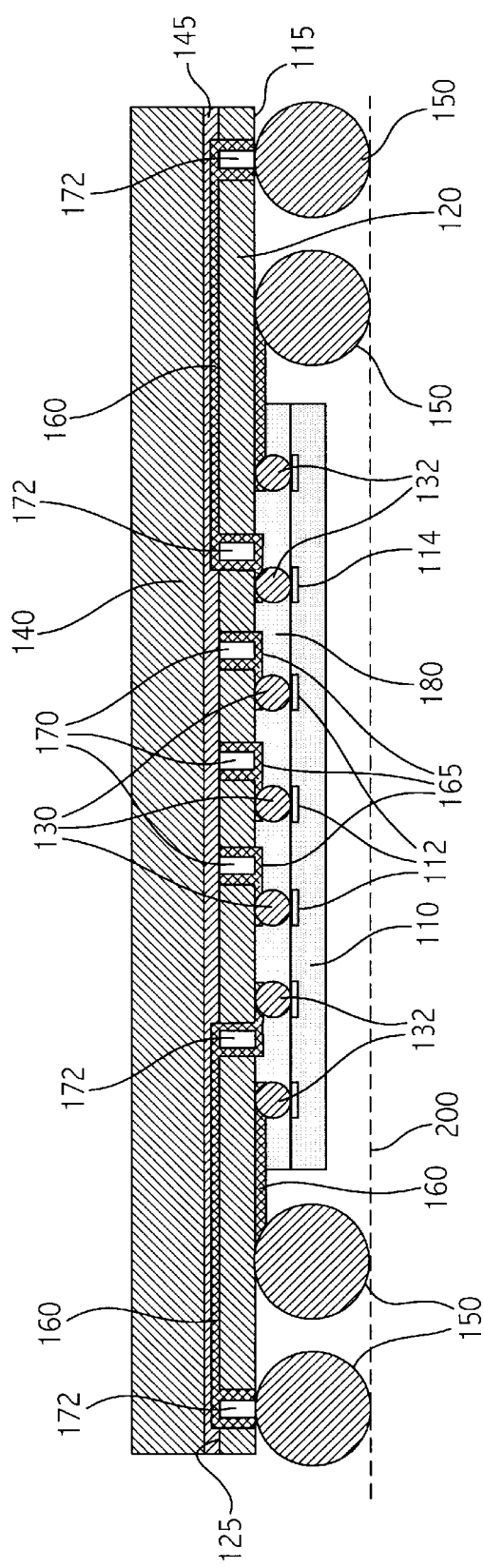
FIG. 1 is a schematic cross-section of a "flip chip" integrated circuit package in accordance with the invention.

As shown in the drawings for the purposes of illustration, the invention is embodied in an integrated circuit package. The package provides improved heat dissipation from the integrated circuit during operation by employing some of the integrated circuit interconnects as pure heat transmission elements. The package can be optimised to ensure that there are sufficient chip-to-board interconnections whilst at the same time providing sufficient heat dissipation so that the integrated circuit chip can operate efficiently.

FIG. 1 shows a first embodiment of the invention in the form of a ball grid array package. In this embodiment, the package includes a flip chip integrated circuit 110 attached to a first major surface 115 of a ball grid array (BGA) substrate 120. A set of eutectic solder balls (also known as solder bumps) 130, 132 are disposed between the integrated circuit chip and the substrate. These solder balls or bumps form the primary interconnects which couple the integrated circuit 110 to the BGA substrate 120.

A stiffening plate 140 is attached to a second surface 125 of the BGA substrate 120 by an thermally-conductive adhesive layer 145. The stiffening plate provides a heat sink for conducting and radiating heat away from the BGA package. The stiffening plate is preferably metallic but could also be formed from an alternative material having similar strength and thermal conductivity characteristics.

A second set of larger solder balls 150 couple the first surface of the BGA substrate 120 to a circuit board substrate 200 and provide the secondary or external interconnects for the integrated circuit package. In an alternative embodiment, the external interconnects could be formed as pins, or even as simple conductive terminals designed to cooperate with pins of a socket connector on a circuit board.

The attachment of flip chips to substrates using eutectic solder balls is a process which is well known in the art. In the present embodiment, the flip chip integrated circuit 110 is attached to the BGA substrate 120 before the BGA substrate 120 is attached to the circuit board substrate 200. The integrated circuit 110 includes an array of conductive pads 112 which are capable of providing signal and power connections to external circuitry. The attachment process aligns and attaches the eutectic solder balls 130, 132 to these conductive pads 112 using known and well established techniques. The integrated circuit 110 is then disposed on the first surface 115 of the BGA substrate 120 such that the attached solder balls 130, 132 align with conductive traces 160 on the substrate. A reflow solder process is then employed to electrically couple the conductive pads 112 to the solder balls 130, 132, and the solder balls 130, 132 to the conductive traces 160. Finally, an underfill 180 is injected between the integrated circuit 110 and the substrate 120 so as to surround and protect the solder ball connections and to provide structural support.

In accordance with the invention, some of the solder balls are provided as interconnecting solder balls 132, and the remaining solder balls are provided as non-interconnecting solder balls 130. The conductive pads 112 that are coupled to the interconnecting solder balls 132 provide signal and power connections between the integrated circuit and external circuitry. In contrast, the conductive pads that are coupled to the non-interconnecting solder balls 130 remain open circuit and are employed purely for heat dissipation purposes.

Each interconnecting solder ball 132 couples to a conductive trace 160 to form a set of individual interconnection circuits between the integrated circuit chip 110 and the input/output solder balls 150. The conductive traces 160 are formed on the first and second surfaces 115, 125 of the substrate and, at appropriate locations, continue through vias 170 extending between the first and second surfaces. For example, an individual interconnection circuit is provided from the conductive pad 114 to the input/output solder ball 150 (at the far left side of FIG. 1) by a combination of the interconnecting solder ball 132 (above the conductive pad 114) and the conductive trace 160. At one end (i.e., the left side of FIG. 1), the conductive trace 160 couples to the interconnecting solder ball 132 on the first surface 115 of the substrate and passes through the via 172 before continuing along the second surface 125 of the substrate to the via 172 (i.e., the via at the far left side of FIG. 1) where the conductive trace passes through the substrate again to the input/output solder ball 150 (i.e., the solder ball at the far left side of FIG. 1).

The non-interconnecting solder balls 130 do not electrically couple to the input/output solder balls 150. Instead, the non-conductive solder balls are thermally coupled to the vias 170 using relatively short conductive traces 165. Direct alignment of the solder balls to the vias 170 is possible, although in this embodiment it is avoided because the solder balls 130 are likely to reflow into the vias 170 causing interconnection failure. The vias 170 form part of a thermal path from the non-conductive solder balls to the adhesive layer 145. The adhesive layer in turn form a thermal path which conducts heat from the vias 170 to the metallic stiffener 140. The short conductive traces 165 are shown extending through the vias 170 in the embodiment of FIG. 1. However, in an alternative embodiment, the short conductive traces 165 may not extend through the vias. In a further preferred embodiment, the space defined by the vias 170 may be filled with a thermally conductive material.

The planar BGA substrate 120 may be a ceramic substrate or a flexible tape substrate. In an alternative embodiment, the planer BGA substrate 120 may be constructed as a laminate structure in which the electrically conductive traces 160 are provided on the internal surfaces of the laminate.

In addition to the pure thermal dissipation properties of the non-interconnecting solder balls, the interconnecting solder balls will also contribute in a similar fashion to the heat dissipation from the integrated circuit chip. However, as has been described, the interconnecting solder balls have the primary function of electrically coupling the integrated circuit chip to the input/output solder balls, unlike the non-interconnecting solder balls.

The ratio of the interconnecting to the non-interconnecting solder balls can be determined to optimise the characteristics of the integrated circuit package to certain applications. The ratio may be dependent on a number of factors which may include the following:

a) The number of input/output connections required for the integrated circuit chip.

b) The number of chip output pads available on the chosen integrated circuit chip.

c) The area density of solder balls/chip output pads for the chosen integrated circuit chip.

d) The thermal performance of the integrated circuit chip under operating conditions.

e) The thermal performance of the integrated circuit package materials, e.g. the substrate, the adhesive layer etc.

Figure 5:
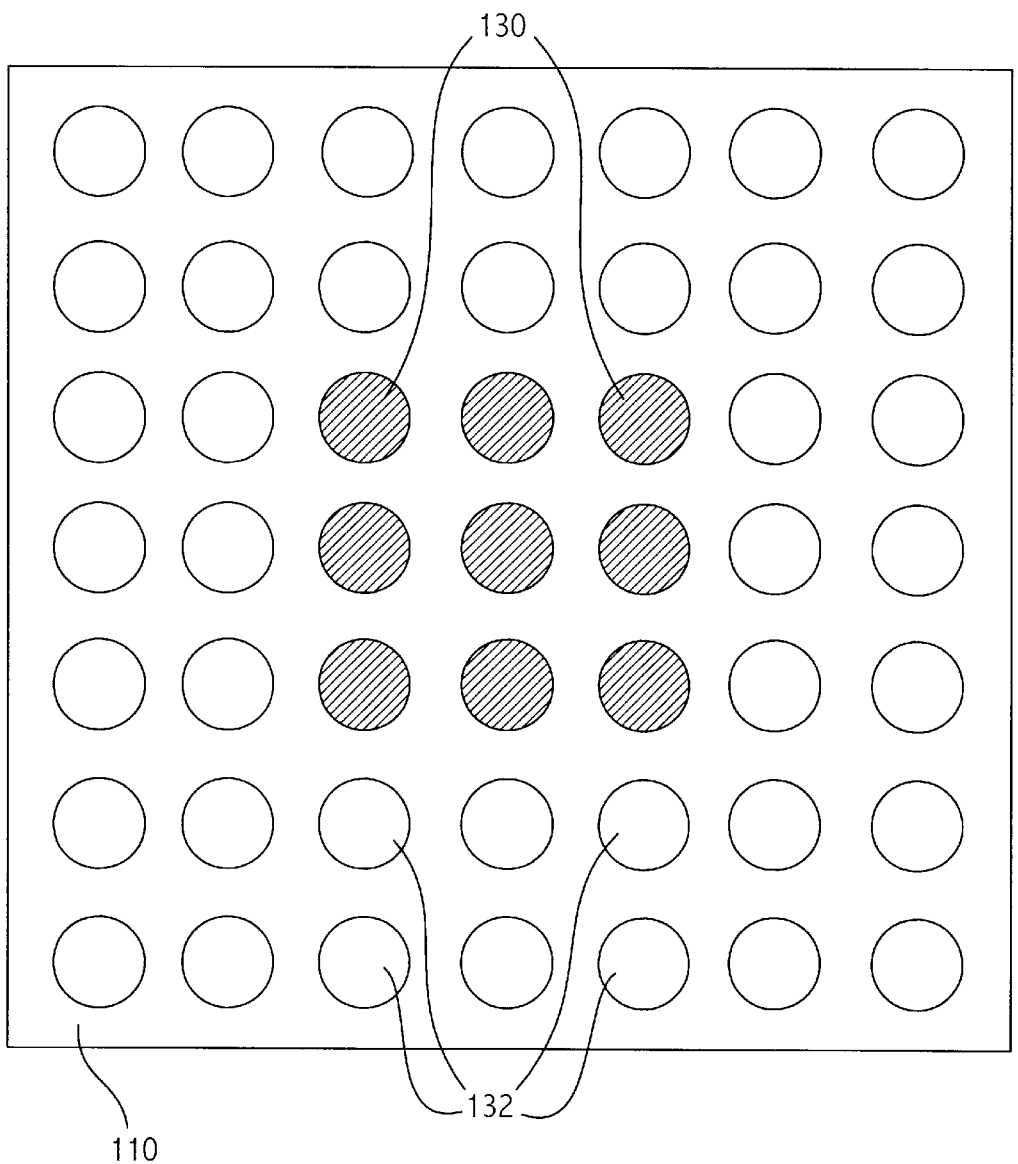
FIG. 5 is a plan view of FIG. 1 showing in isolation the solder balls and the integrated circuit chip.

FIG. 5 is a plan view of FIG. 1 showing in isolation the solder balls and the integrated circuit chip. FIG. 5 illustrates the grid-like arrangement of the solder balls 130, 132 mounted on the surface of integrated circuit chip. In this embodiment, the nine most central solder balls are non-interconnecting solder balls and the two outermost layers of solder balls are interconnecting solder balls. During operation, the rate of heat generated by the integrated circuit chip can be assumed to be substantially uniform across areas of the chip. However, because there is little heat generation outside of the chip area, a temperature gradient will naturally occur over the chip, with the greatest temperatures occurring towards the centre of the chip. The positioning of the non-interconnecting solder balls at the centre of the chip is therefore most effective for heat dissipation. This positioning has the advantage that heat dissipation may be focussed on the central region of the chip where heat build-up tends to be greater.

The positioning of the interconnecting solder balls towards the perimeter of the grid has the advantage that the electrically conductive traces 160 may be coupled to the solder balls more easily. If the conductive traces had to extend towards the centre of the solder ball grid then there would be problems with routing especially for high number and high density solder ball grids. The conductive traces would need to become progressively narrower towards the centre of the grid as space becomes restricted. Such narrower traces would be slower and more expensive to produce.

In an alternative embodiment, the positioning of the non-interconnecting solder balls may be optimised to a particular chip design or layout. The general position of the non-interconnecting solder balls 130 would then correspond to a region of the chip where heat build-up has been measured or predicted to be the greatest. For example, for a computer chip containing random access memory regions, input/output regions, and CPU regions, the CPU region would most likely run the hottest and would benefit the most from the thermally-dissipating pads 112 and the thermally conducting solder balls 130.

In a modified embodiment of the package of FIG. 1, the substrate is a flexible tape substrate. The tape substrate provides particular advantages for the BGA package such as increased speed of production, reduced cost relative to ceramic substrates, and the ability to generate the multiple vias in the substrate (density of vias can be greater in tape). The package of FIG. 1 including the flexible tape substrate is simple in construction and is sufficiently rigid due to the stiffener 140 mounted on the substrate.

Figure 2:
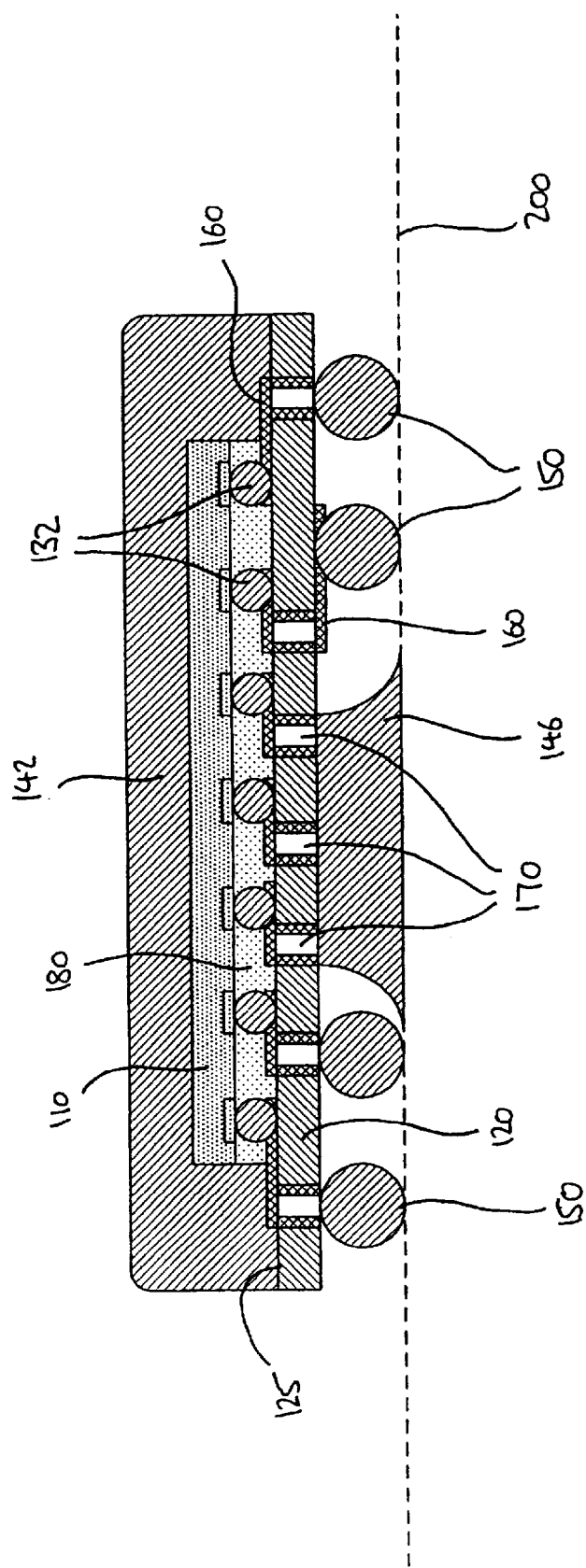
FIG. 2 is a schematic cross-section of another "flip chip" integrated circuit package in accordance with the invention.

FIG. 2 shows another embodiment of the invention. Unlike the first embodiment of the invention, this embodiment includes a flip chip integrated circuit 110 attached to the second surface 125 of the BGA substrate 120. The electrical interconnections of the integrated circuit 110 to the larger input/output solder balls 150 are again formed by interconnecting eutectic solder balls 132 coupled to conductive traces 160. An underfill material 180 is injected between the integrated circuit 110 and the substrate 120 so as to surround and protect the solder ball connections and to provide structural support.

To protect the integrated circuit 110 and the conductive traces 160, an overmold or encapsulant 142, made for example of a plastics or composite plastics material, covers the whole second surface 125 of the BGA substrate 120. The encapsulant 142 is preferably thermally conductive and serves to conduct heat away from the integrated circuit 110.

In accordance with the invention, heat dissipation is improved in this embodiment by having non-interconnecting eutectic solder balls 130 aligned with heat transmitting vias 170. This embodiment includes a thermally conductive adhesive 146 between the BGA substrate and the circuit board 200. The conductive adhesive 146 conducts heat from the vias 170 to the circuit board 200. The process of injecting conductive adhesives between BGA substrates and circuit boards is well known in the art.

Figure 3:
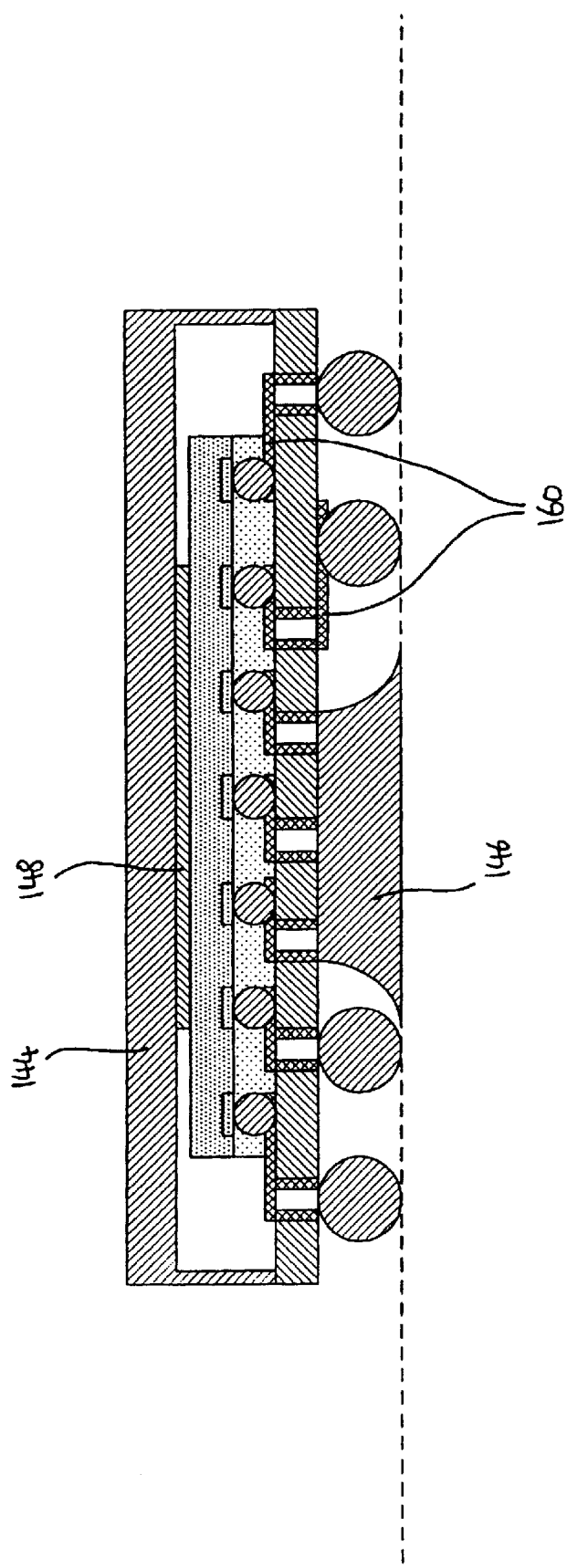
FIG. 3 is a schematic cross-section of a further "flip chip" integrated circuit package in accordance with the invention.

FIG. 3 shows a third embodiment of the invention. Unlike the embodiment of FIG. 2, in this embodiment the encapsulant 142 has been replaced by a lid 144 to protect the integrated circuit 110 and the conductive traces 160. The lid 144 is mounted to the second surface of the BGA substrate using techniques known in the art. The top surface of the integrated circuit is thermally coupled to the lid 144 by means of a thermally conductive layer 148. The lid 144 is made, for example, of a metal or metal alloy and serves to conduct heat away from the integrated circuit 110.

According to one preferred embodiment, the secondary interconnects are located on the first major surface of the planar substrate. A stiffening plate may then be mounted in a coplanar adjacent relationship on the second major surface of the planar substrate and thermally coupled to the second subset of primary interconnects so as to provide a heat sink for dissipating heat from the chip die. The stiffening plate has the advantage of adding strength to the integrated circuit package which is particularly important if the package substrate is a flexible tape.

In an alternative embodiment, the secondary interconnects are located on the second major surface of the planar substrate. A stiffening plate with a central opening may then be located on the first major surface of the planar substrate. The opening surrounds the integrated circuit chip which is also located on the first major surface of the planar substrate. With the chip die and the secondary interconnects located on opposite sides of the substrate, the area of the substrate can be reduced relative to packages in which the chip die and the secondary interconnects are located on the same side of the substrate.

Figure 4:
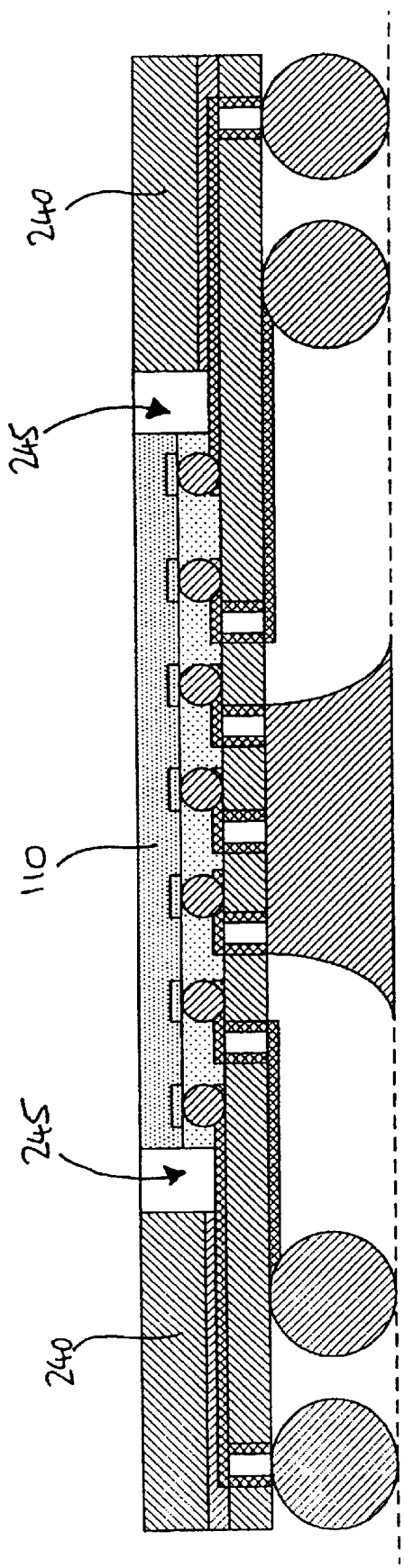
FIG. 4 is a schematic cross-section of a still further "flip chip" integrated circuit package in accordance with the invention.

FIG. 4 shows a fourth embodiment of the invention. This embodiment incorporates the heat dissipation characteristics of the embodiments of FIGS. 2 and 3 and the stiffener of the embodiment of FIG. 1. The stiffener 240 in FIG. 4 is a square-shaped planar ring with a central opening 245 in which the chip die 110 is located. The stiffener 240 helps to strengthen the substrate, in particular when the substrate is a taped substrate. An overmold compound may optionally be added over the top of the stiffener 240 and the chip die 110 to hermetically seal the package.

It will be evident in view of the foregoing that various modifications may be made within the scope of the present invention. For example, the larger solder balls could be replaced by other suitable input/output terminals such as metallic pins.

What is claimed is:

1. An integrated circuit package comprising:

a substrate having a fist surface and a second surface;

a chip die mounted to the first surface of the substrate;

a plurality of pads carried by the chip die on a surface of the chip die that faces the first surface of the substrate, a first subset of the pads in electrical communication with circuitry in the chip die and a second subset of the pads in thermal communication with the chip die;

a plurality of external interconnects carried by the substrate on the first surface of the substrate;

a plurality of conductive traces coupled to the external interconnects and the first subset of the pads for carrying electrical signals between the external interconnects and the first subset of the pads; and a plurality of thermal conductors thermally coupled to the second subset of the pads and the first surface of the substrate to carry heat from the second subset of the pads to the substrate.

2. An integrated circuit package as claimed in claim 1, wherein the thermal conductors comprise a set of solder bumps that are thermally coupled to the second subset of the pads of the chip die and to the substrate.

3. An integrated circuit package as claimed in claim 2, wherein the package further comprises thermal vias which extend through the substrate and are thermally coupled to the thermal conductors.

4. An integrated circuit package as claimed in claim 1, wherein the external interconnects are electrically-conductive solder balls exposed on the first surface of the substrate.

5. An integrated circuit package as claimed in claim 1, wherein the external interconnects are exposed on the first surface of the substrate.

6. An integrated circuit package as claimed in claim 1, wherein the pads are arranged in a grid.

7. An integrated circuit package as claimed in claim 7, wherein the conductive traces are positioned generally on the periphery of the grid.

8. An integrated circuit package as claimed in claim 7, wherein the thermal conductors are positioned generally centrally on the grid.

9. An integrated circuit package as claimed in claim 1, wherein the substrate is a planar laminate structure.

10. An integrated circuit package as claimed in claim 1, wherein the substrate is formed from ceramic.

11. An integrated circuit package as claimed in claim 1, wherein the substrate is formed from a flexible tape.

12. An integrated circuit package as claimed in claim 1, further comprising a stiffening plate located on the substrate and thermally coupled to the thermal conductors so as to provide a heat sink for dissipating heat from the chip die.

13. An integrated circuit package as claimed in claim 12, wherein the stiffening plate defines an opening in which the chip die is disposed.

14. An integrated circuit package as claimed in claim 12, wherein the stiffening plate is metallic.

15. An integrated circuit package comprising:

a substrate having a fist surface and a second surface;

a chip die mounted to the second surface of the substrate;

plurality of pads carried by the chip die on a surface of the chip die that faces the second surface of the substrate, a first subset of the pads in electrical communication with circuitry in the chip die and a second subset of the pads in thermal communication with the chip die;

a plurality of external interconnects carried by the substrate on the first surface of the substrate;

a plurality of conductive traces coupled to the external interconnects and the first subset of the pads for carrying electrical signals between the external interconnects and the first subset of the pads;

a plurality of thermal conductors thermally coupled to the second subset of the pads and the second surface of the substrate to carry heat from the second subset of the pads to the substrate; and a stiffening plate in thermal contact with the second surface of the substrate, the stiffening plate defining an opening in which the chip die is disposed.

16. An integrated circuit package as claimed in claim 15 wherein the stiffening plate is metallic.

* * * * *